United States Patent
Park

(10) Patent No.: US 8,232,160 B2
(45) Date of Patent: Jul. 31, 2012

(54) PHASE CHANGE MEMORY DEVICE AND METHOD OF MANUFACTURING THE SAME

(75) Inventor: Nam Kyun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/404,481

(22) Filed: Feb. 24, 2012

(65) Prior Publication Data

US 2012/0156840 A1 Jun. 21, 2012

Related U.S. Application Data

(62) Division of application No. 12/641,549, filed on Dec. 18, 2009, now Pat. No. 8,129,746.

(30) Foreign Application Priority Data

Jun. 26, 2009 (KR) .................. 10-2009-0057818

(51) Int. Cl.
*H01L 21/8234* (2006.01)
*H01L 23/48* (2006.01)

(52) U.S. Cl. ...................................... 438/237; 257/178
(58) Field of Classification Search .............. 257/178, 257/288, 367, 656, E29.337; 438/50, 237
See application file for complete search history.

(56) References Cited

U.S. PATENT DOCUMENTS

| 7,858,960 | B2 | 12/2010 | Chang |
| 7,897,482 | B2 | 3/2011 | Toriumi |
| 7,902,051 | B2 * | 3/2011 | Rajendran et al. ............ 438/487 |
| 8,129,746 | B2 * | 3/2012 | Park .............................. 257/178 |
| 2010/0163830 | A1 | 7/2010 | Chang et al. |

FOREIGN PATENT DOCUMENTS

| KR | 10-0827697 B1 | 4/2008 |
| KR | 1020090050302 A | 5/2009 |

OTHER PUBLICATIONS

USPTO RR mailed May 2, 2011 in connection with U.S. Appl. No. 12/641,549.
USPTO NFOA mailed Jul. 13, 2011 in connection with U.S. Appl. No. 12/641,549.
USPTO NOA mailed Nov. 2, 2011 in connection with U.S. Appl. No. 12/641,549.

* cited by examiner

*Primary Examiner* — Calvin Lee
(74) *Attorney, Agent, or Firm* — Ladas & Parry LLP

(57) ABSTRACT

A phase change memory device having a strain transistor and a method of making the same are presented. The phase change memory device includes a semiconductor substrate, a junction word line, switching diodes, and a strain transistor. The semiconductor substrate includes a cell area and a core/peri area. The junction word line is formed in the cell area of the semiconductor substrate and includes a strain stress supplying layer doped with impurities. The switching diodes are electrically coupled to the junction word line. The strain transistor is formed in the core/peri area of the substrate and acts as a driving transistor.

8 Claims, 2 Drawing Sheets

PHASE CHANGE MEMORY DEVICE AND METHOD OF MANUFACTURING THE SAME

CROSS-REFERENCES TO RELATED APPLICATION

The present application claims priority under 35 U.S.C. 119(a) to Korean application number 10-2009-0057818, filed on Jun. 26, 2009, in the Korean Patent Office, which is incorporated by reference in its entirety as if set forth in full.

BACKGROUND OF THE INVENTION

1. Technical Field

The inventive concept relates to a phase change memory device and a method of manufacturing the same and, more particularly, to a phase change memory device being capable of improving current driving capacity and a method of manufacturing the same.

2. Related Art

Demand for low power consumption in next-generation memory devices has been under development. A phase change memory device which is one of the next-generation memory devices stores binary information by reversibly switching a phase change material, such as a germanium (Ge)-antimony (Sb)-tellurium (Te)-based material, between a crystalline solid state phase and an amorphous solid state phase driven by different amounts of heat which is locally generated by electrical pulses.

That is, the phase change memory device can be driven to reversibly change phases between the amorphous and crystalline states by applying an electrical current (i.e., Joule's heat) across the phase change material. At this time, the phase change material exhibits a low resistance in the crystalline state and a high resistance in the amorphous state. The crystalline state can be arbitrarily defined as a SET state corresponding to a logic level "0" and the amorphous state can be defined as a RESET state corresponding to logic level "1". According to this scheme, phase change memory devices can be used to store and read digital data corresponding to binary on-off states by using this resistive difference corresponding to each particular solid state phase of the phase change material.

Herein, the reversible solid state phase changes in the phase change material can be driven by an applied current therethrough and this applied current can be generated by an electric field formed between a word line and a bit line. For example, the word line may be comprised of a junction region contacts to a switching device of the phase change memory device and the bit line may be comprised of a metal wiring which contacts with an upper electrode of the phase change memory device.

The phase change memory device may also be divided into a cell area where memory cell arrays are arranged therein and a core/peripheral area where memory cell driving devices are arranged therein.

Presently, the memory cell arrays and the driving transistors of the phase change memory device are formed on conventional silicon substrates and have driving transistors are formed in the core/peri area that use a polysilicon layer or a polycide layer as a gate. Due to an improvement in an integration and performance, there is a demand for even higher current driving capacities in the phase change memory device.

However, there is a physical limit to which to improve the current driving capacity of a switching device comprising a memory cell array and the driving transistors which affects the current characteristics.

SUMMARY

According to one aspect of an exemplary embodiment, a phase change memory device includes a semiconductor substrate including a cell area and a core/peri area, a junction word line formed in the cell area of the semiconductor substrate and being comprised of a strain stress supplying layer doped with dopants, a plurality of switching diodes configured to be electrically connected to the junction word line, and a strain transistor formed in the core/peri area of the semiconductor substrate as a driving transistor.

According to another aspect of another exemplary embodiment, there is provided a method of manufacturing a phase change memory device. First, a semiconductor substrate which a cell area and a core/peri area are defined in is provided and a gate of a driving transistor is formed on the core/peri area of the semiconductor substrate. A strain stress supplying layer is formed on the semiconductor substrate in the cell area and on the semiconductor substrate of both sides of the gate in the core/peri area. Impurities of a first conductivity are implanted into the strain stress supplying layer to form a junction word line in the cell area and simultaneously to form source and drain of the driving transistor in the core/peri area. Subsequently, an interlayer insulating layer is formed over the semiconductor substrate which the junction word line and the source and drain are formed in and switching diodes are formed within the interlayer insulating layer to be connected to the junction word line.

These and other features, aspects, and embodiments are described below in the section entitled "DETAILED OF EXEMPLARY EMBODIMENTS."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
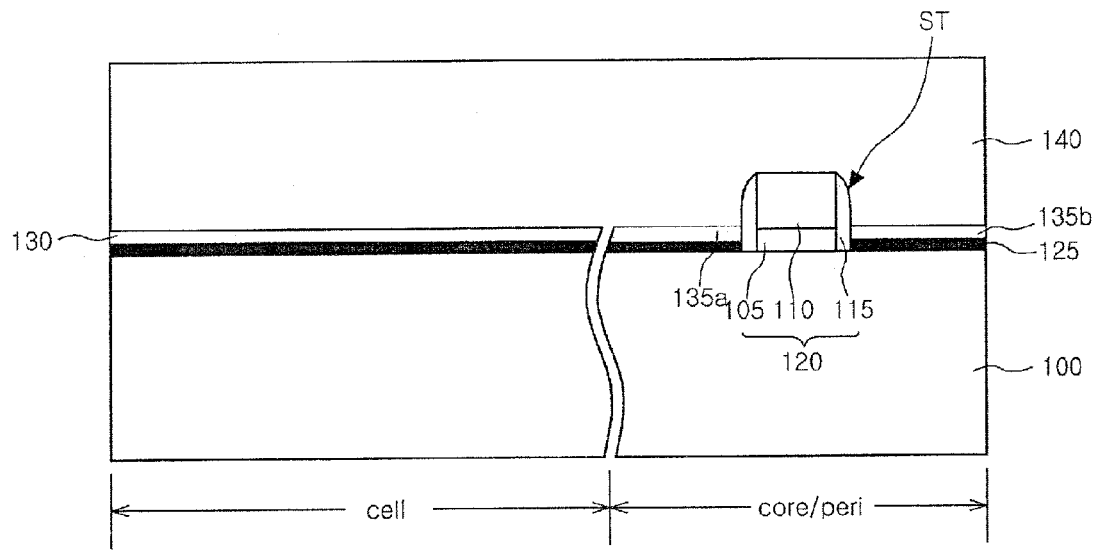
FIGS. 1 through 3 are sectional views illustrating a method of manufacturing a phase change memory device according to an exemplary embodiment.

Hereinafter, the inventive concept will be described in detail by explaining embodiments of the inventive concept with reference to the attached drawings. The inventive concept may, however, be modified in many different forms and should not be constructed as being limited to the embodiments set forth herein. Rather, these embodiments are provided so that this disclosure will be through and complete, and will be fully convey the inventive concept to one of ordinary skill in the art. In the drawings, shapes of the elements, etc. may be exaggerated for clarity. Like reference numerals in the drawings denote like elements. It is also understood that when a layer is referred to as being "on" another layer or substrate, it can be directly on the other or substrate, or intervening layers may also be present.

A phase change memory device of the inventive concept may provide a strain transistor using a strain stress as a driving transistor and may use a SiGe junction region as a word line so as to improve the current driving capacity. In addition, the terminology "a strain transistor" may be referred to as a transistor that uses a strain stress supplying layer as a junction region, in an exemplary embodiment. Hereinafter, the phase change memory device having the above structure will be described in more detail.

Referring to FIG. 1, a semiconductor substrate 100 is provided in which a junction word line 130 is formed in a cell area thereof and a strain transistor ST is formed in a core/peripheral area (hereinafter core/peri area) thereof which functions as a driving transistor.

The strain transistor ST may be formed by the following method. First, a gate insulating layer 105 and a gate conduction layer 110 are sequentially stacked on the semiconductor substrate 100, e.g., a silicon substrate. Then, the gate conduction layer 110 and the gate insulating layer 105 are patterned to remain in a portion of the core/peri area, thereby forming a gate structure. Subsequently, insulating spacers 115 are formed on both sidewalls of the gate structure by using any number of convention processes so that a gate 120 of the strain transistor ST is formed.

Next, a strain stress supplying layer is formed on the core/peri area in both sides of the gate 120 and on the cell area. In the exemplary embodiment, a material for inducing a strain stress with the silicon substrate, for example a SiGe layer may be used as the strain stress supplying layer.

N-type impurities are implanted into the strain stress supply layer to form a junction word line 130 in the cell area and to form the source and drain 135a and 135b in the core/peri area to form the strain transistor ST. Herein, since the stain stress supplying layer is formed on the semiconductor substrate 100 at a desired thickness following forming the gate 120, the source and drain 135a and 135b may be arranged in the sidewalls of the gate 120 and may be thicker than the gate insulating layer 105 and thinner than the gate 120.

As is well known, when impurities are implanted into a SiGe layer which is the strain stress supplying layer to form the junction region, then the implanted SiGe layer exhibits a lower resistance than that of silicon. Therefore, when the junction word line is formed of the strain stress supplying layer, the resistance of the junction word line can be further reduced, which thereby improves the current driving capacity.

Similarly, when the source and drain 135a and 135b of the driving transistor are formed of the strain stress supplying layer, then the junction resistance of the source and drain can be reduced as compared with the silicon source and drain, which thereby improves the current characteristics.

In addition, when the source and drain 135a and 135b are formed of the strain stress supplying layer, the strain stress is applied to the channel region (the semiconductor substrate region) between the source and drain 135a and 135b due to material property difference which further improves carrier mobility. The technology is disclosed by T. Ghani ["A 90 nm high volume manufacturing logic technology featuring novel 45 nm gate length strained silicon CMOS Transistor", IEEE, 2003].

At this time, a buffer layer 125 may be further formed to prevent lattice defects between the semiconductor substrate 100 and the strain stress supplying layers 130, 135a and 135b. Herein, the buffer layer 125 may comprise a semiconductor layer which is formed of a material having a middle lattice property, i.e., a lattice constant between that of the SiGe layer which constitutes the strain stress supplying layers 130, 135a and 135b and that of Si which constitutes the semiconductor substrate 100.

Next, a first interlayer insulating layer 140 is formed over the semiconductor substrate 100 which the junction word line 130 and the strain transistor ST are completed therein.

Figure 2:
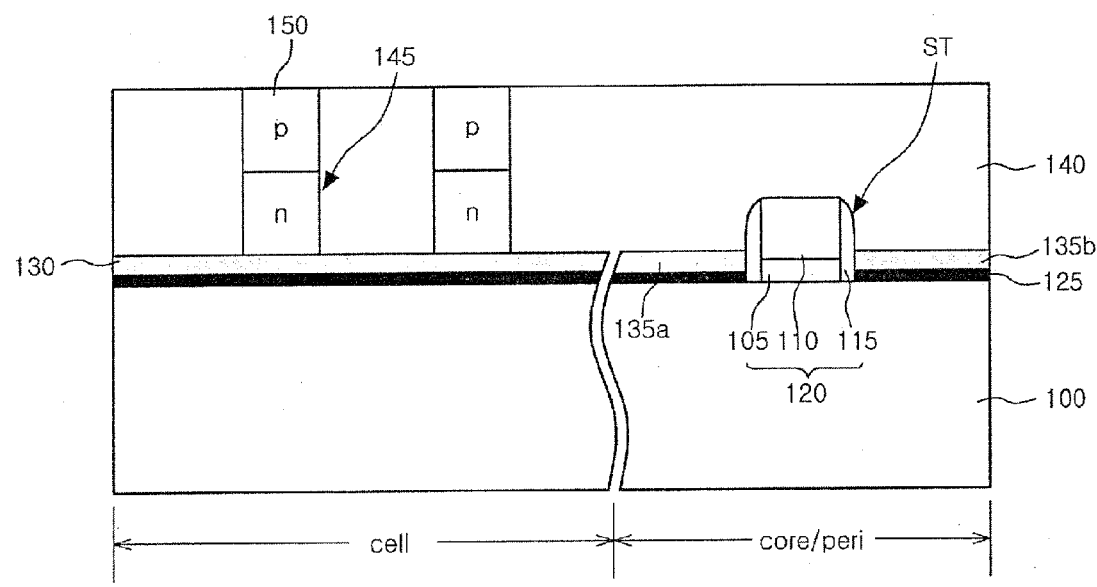

FIG. 2 is a sectional view of the phase change memory device that switching diodes 150 which are contacted with the junction word line 130 are formed within the first interlayer insulating layer 140. The switching diodes 150 will be formed by the following process.

First, the first interlayer insulating layer 140 is etched to form diode contact holes 145 exposing portions of the junction word line 130. Then, a semiconductor layer fills in the diode contact holes. The semiconductor layer may be formed by growing a SiGe layer by using the SiGe layer constituting the junction word line 130 as a base by using a selective epitaxial growth (SEG) process or a solid phase epitaxy (SPE) process, or by depositing a polysilicon layer. Then, N-type impurities are implanted in the semiconductor layer and sequentially P-type impurities are implanted in the semiconductor layer such the switching diodes 150 having PN junctions are formed.

Herein, when the SiGe layer is formed as the semiconductor layer, the switching diode 150 becomes a SiGe diode which has a lower threshold voltage of about 0.5V as compared with the Si diode of about 0.8V. This is due to the band gap energy difference between Si and SiGe. As above, if the switching diode 150 comprises that of the SiGe diode, the threshold voltage is lowered so that the operation voltage can be likewise lowered. In addition, if the same operation voltage as a conventional art is used, then switching diode 150 made of SiGe can convey a much larger amount of operation current as compared to a Si diode.

Figure 3:
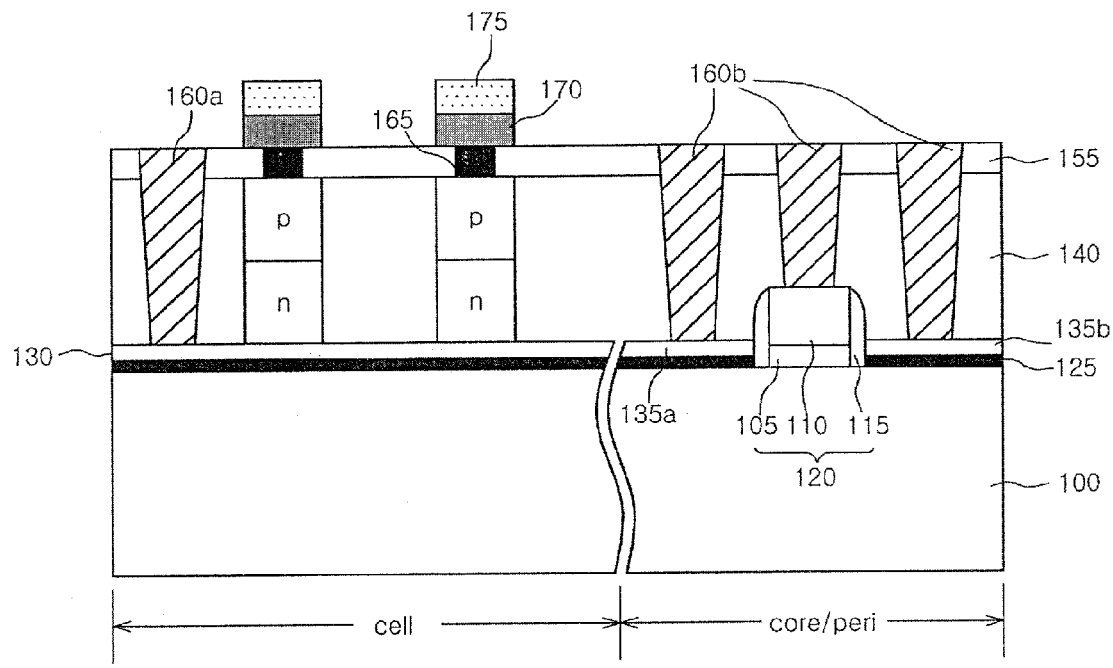

FIG. 3 is a sectional view of the phase change memory device that heating electrodes 165 and phase change structures connected to the switching diodes 150 and transistor electrode plugs 160b are formed. The heating electrodes 165, the phase change structures and the transistor electrode plugs 160b will be formed by the following process.

First, a second interlayer insulating layer 155 is formed on the resultant of the semiconductor substrate 100 in which the switching diode 150s are formed therein. The second interlayer insulating layer 155 may be formed of an insulating layer that exhibits an excellent heat-resistant, e.g., a silicon nitride layer.

Portions of the second interlayer insulating layer 155 are etched to form heating electrode contact holes (not shown) exposing upper surfaces of the switching diodes 150. A conduction layer is filled within the heating electrode contact holes to form the heating electrodes 165. The heating electrode 165 may be formed to have a dimension as narrow as possible so as to form a narrow contact area with the phase change structure. It may also be formed of a conduction material having a low resistivity so as to exhibits a high heating efficiency property. The conduction material may be any one selected from the group consisting of a metal, an alloy, a metal oxynitirde, an oxynitirde, a conductive carbon compound or a semiconductor material. For example, the conduction material may be any one selected form the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, Pt, TiSi, TaSi, TiW, TiON, TiAlON, WON, TaON, $IrO_2$, polysilicon or SiGe. In addition, if the metal material is used as the heating electrode 165, although now shown in the drawings, ohmic contact layers may be further formed on the upper surfaces of the switching diodes 150 so as to form the ohmic contact with the switching diodes 150.

Portions of the second and first interlayer insulating layers 155 and 140 are etched to form contact holes (not shown) which expose a portion of the junction word line 130 along one side of the switching diode 150 and upper portions of the gate 120 and source and drain 135a and 135b of the strain stress transistor ST. The conduction layer is filled within the contact holes to form a word line plug 160a and transistor electrode plugs 160b. The word line plug 160a is a first plug that electrically connect the junction word line 130 to a metal word line (not shown) which is to be formed over the bit line (not shown) in the following process. The transistor electrode plugs 160b are first plugs that electrically connects the gate 120 and the source and drain 135a and 135b to the electrode wirings (not shown) which is to be formed over the bit line in the following process.

Subsequently, a phase change material layer 170 and an upper electrode 175 are sequentially formed over the resultant semiconductor substrate 100. The phase change material layer 170 is formed of any one selected from the group consisting of Te, Se, Ge, a combination thereof or an alloy thereof. For example, the phase change material layer 170 is formed of any one selected from the group consisting of Te, Se, Ge, Sb, Bi, Pb, Sn, As, S, Si, P, O, a combination thereof or an alloy thereof. The phase change material having a high temperature crystallization property may comprise a combination of Ge, Sb and Te. The phase change material having a low temperature crystallization property may comprise a combination of Bi, Te, Se and Sb.

Next, portions of the upper electrode 175 and the phase change material layer 170 are patterned to be separately contacted with the heating electrodes 165, respectively, thereby forming the phase change structures.

Although not shown in drawings, hereinafter, a bit line is formed over the phase change structures that electrically contact with the phase change structures and the metal word line which is electrically connected to the word line plug 160a is formed over the bit line. In addition, the electrode wirings are formed over the core/peri area that contact to the transistor electrode plugs 160b.

As above distinctly described, in the phase change memory device of the exemplary embodiment, the junction word line is formed of a SiGe layer for supplying a strain stress and simultaneously, the source and drain of the driving transistor driving the memory cell is formed of a SiGe layer.

According to this, the resistance of the junction word line can be reduced and the current driving capacity can be improved. If the switching diode is formed of the SiGe diode using the SiGe junction word line as a base, the threshold voltage of the switching diode 150 can be lowered, thereby ensuring a lower voltage characteristic and higher current characteristic.

In addition, the operating current characteristic can be improved by improving the junction resistance in the driving transistor as well as the carrier mobility can be improved by applying strain stress to the channel region.

Figure 4:
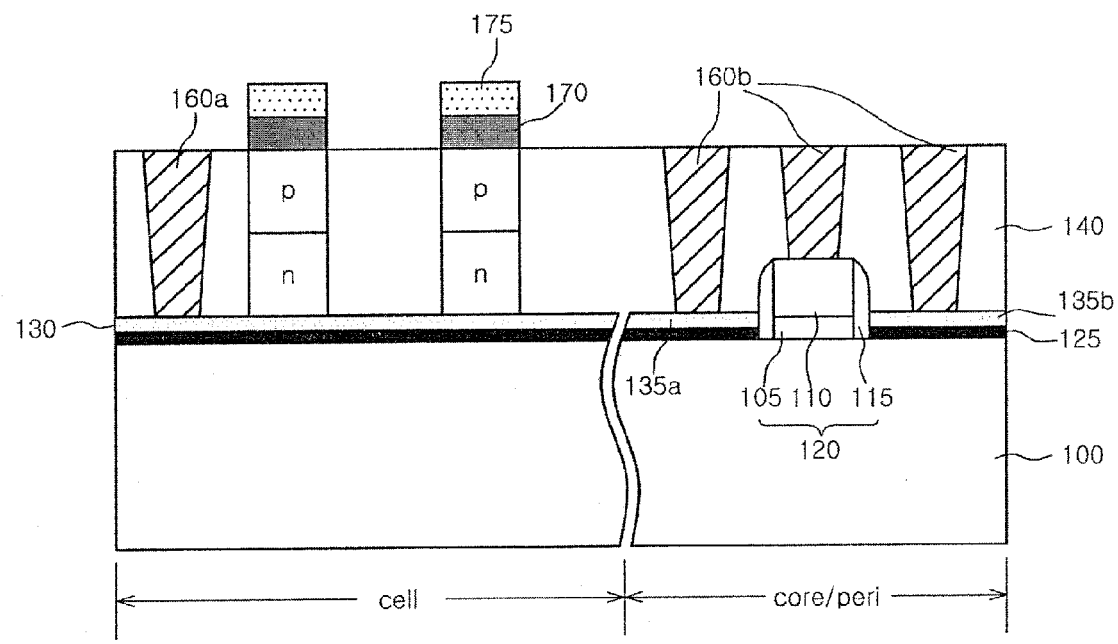
FIG. 4 is a sectional view of a phase change memory device according to another exemplary embodiment.

This inventive concept is understood to be not limited to the above exemplary embodiment. Although the exemplary embodiment illustrates the phase change memory device having the heating electrode as a conventional phase change memory device, when the switching diode 150 is formed of a SiGe layer as above, it in itself serves as the heating electrode. Therefore, as shown in FIG. 4, the phase change structure 165 and 170 is directly formed on the switching diode 150 without forming a separate heating electrode.

While certain embodiments have been described above, it will be understood that the embodiments described are by way of example only. Accordingly, the devices and methods described herein should not be limited based on the described embodiments. Rather, the devices and methods described herein should only be limited in light of the claims that follow when taken in conjunction with the above description and accompanying drawings.

What is claimed is:

1. A method of manufacturing a phase change memory device, comprising:
    providing a semiconductor substrate having a cell area and a core/peri area defined therein;
    forming a gate of a driving transistor in the core/peri area of the semiconductor substrate;
    forming a strain stress supplying layer in the cell area of the semiconductor substrate and in the core/peri area of the semiconductor substrate along opposing sides of the gate;
    simultaneously forming a junction word line in the cell area and forming source/drain of the driving transistor in the core/peri area by implanting impurities of a first conductivity into the strain stress supplying layer;
    forming an interlayer insulating layer over the semiconductor substrate in which the junction word line and the source/drain are formed therein; and
    forming switching diodes within the interlayer insulating layer that are connected the junction word line.

2. The method of claim 1, wherein the semiconductor substrate comprises a silicon substrate, and the strain stress supplying layer comprises a SiGe layer.

3. The method of claim 1, further comprising forming a buffer layer having a lattice property between that of the semiconductor substrate and that of the strain stress supplying layer on an exposed portion of the semiconductor substrate wherein forming the buffer layer is performed after forming the gate and before forming a strain stress supplying layer.

4. The method of claim 1, wherein the forming switching diodes includes:
    forming diode contact holes exposing portions of the junction word line by etching the interlayer insulating layer;
    forming a semiconductor layer to fill in the diode contact holes;
    implanting impurities of a first conductivity into the semiconductor layer; and
    implanting impurities of a second conductivity into the semiconductor layer.

5. The method of claim 4, wherein the forming semiconductor layer includes an epitaxial grown semiconductor layer which uses the junction word line as a base.

6. The method of claim 4, wherein forming the semiconductor layer includes depositing a polysilicon layer.

7. The method of claim 1, further comprising: after the forming switching diodes,
    forming heating electrodes contacting the switching diodes;
    forming phase change structures contacting the heating electrodes; and
    forming a bit line electrically connected to the phase change structures.

8. The method of claim 1, further comprising:
    forming phase change material structures contact to the switching diodes; and
    forming a bit line electrically connected to the phase change structures, wherein forming the phase change material and the bit line are performed after forming the switching diodes.

* * * * *